United States Patent [19]

Fukushima

[11] Patent Number: 5,764,075
[45] Date of Patent: Jun. 9, 1998

[54] INPUT CIRCUIT FOR MODE SETTING

[75] Inventor: Kiyoshi Fukushima, Tokyo, Japan

[73] Assignee: NEC Corporation, Tokyo, Japan

[21] Appl. No.: 736,498

[22] Filed: Oct. 24, 1996

[30] Foreign Application Priority Data

Oct. 25, 1995 [JP] Japan ................... 7-277324

[51] Int. Cl.$^6$ .................. H03K 17/173; H03K 19/00
[52] U.S. Cl. ............................... 326/38; 326/57
[58] Field of Search ................... 326/56, 57, 37, 326/38; 327/205, 206, 215

[56] References Cited

U.S. PATENT DOCUMENTS

| | | | |
|---|---|---|---|
| 4,985,641 | 1/1991 | Nagayama et al. | |
| 5,321,316 | 6/1994 | Nakajima | 326/57 |
| 5,532,957 | 7/1996 | Malhi | 326/38 |
| 5,598,110 | 1/1997 | Chang | 326/60 |
| 5,684,411 | 11/1997 | Nepple | 3326/38 |

FOREIGN PATENT DOCUMENTS

| | | |
|---|---|---|
| 0535776 | 4/1993 | European Pat. Off. |
| 0573965 | 12/1993 | European Pat. Off. |
| 3206409 | 9/1991 | Japan |

*Primary Examiner*—Edward P. Westin
*Assistant Examiner*—Richard Roseen
*Attorney, Agent, or Firm*—Sughrue, Mion, Zinn, Macpeak & Seas, PLLC

[57] ABSTRACT

In order to provide an input circuit for mode setting with a simple configuration sufficiently stable and without unnecessary current consumption, the input circuit of the invention, for outputting a control signal (MODE OUT) according to a status of a mode setting terminal (I1), comprises latch means (100) being reset with a rising edge of a reset signal (RES) to output the control signal (MODE OUT) of logic LOW and latching logic of the mode setting terminal (I1) with a falling edge of a delayed signal (RESD) of said reset signal (RES) for maintaining to output inverse or the same logic of said logic of the mode setting terminal (I1) latched, and pull-up or pull-down means (P1) becoming ON for pulling up or down the mode setting terminal (I1) to logic HIGH or LOW when the mode setting terminal (I1) is left open gated by logic LOW of the control signal (MODE OUT) and becoming OFF for cutting a current flowing through the mode setting terminal (I1) gated by logic HIGH of the control signal (MODE OUT).

6 Claims, 3 Drawing Sheets

INPUT CIRCUIT FOR MODE SETTING

BACKGROUND OF THE INVENTION

This invention relates to an input circuit for mode setting, and more particularly to that of low power dissipation applied for setting operational mode of a microcomputer chip, for instance.

Recently, integration technologies of semiconductor devices are remarkably developed, enabling to design multi-functional microcomputer chips without difficulties.

As an example of them, there is realized a bi-functional microcomputer chip equipped with additional patterns for in-circuit emulation, in order to economize times and costs for program developing, wherein the additional patterns are to be inactivated when the microcomputer chip is served for its original use. For the purpose, there is provided a bonding pat on the microcomputer chip of this kind, connected to an input circuit for selecting an operation mode of the microcomputer and to be bonded in a manufacturing process to a ground GND or a power supply VDD for determining the operation mode according to actual use.

As it is impractical to prepare bonding pads for the ground GND and the power supply VDD right and left of the bonding pad for mode selection, the input circuit is generally designed to control the operation mode corresponding to whether the concerning bonding pad is bonded to the ground GND, for example, or left open un-bonded.

However, when the bonding pad is merely left open, a through current flows from the power supply VDD to the ground GND through an nMOS transistor and a pMOS transistor consisting in the input stage of the input circuit with their gates connected to the bonding pad left at high impedance, dissipating a power consumption. So, some countermeasures are devised for preventing the through current, by providing a pull-up resistor in the input stage, for example.

FIG. 5 shows an example of the input circuit of this kind, wherein a mode select signal MODE from the bonding pad I1, which is coupled to a power supply VDD through a pull-up resistor R1, is connected to an input terminal of an inverter 501 having a hysteresis characteristic for outputting control signal MODE OUT to be supplied to inner circuits of the microcomputer chip.

In the conventional input circuit of FIG. 5, when the bonding pad I1 is bonded to the ground GND, the power supply voltage divided by the pull-up resistor R1 and the wiring resistance concerning the bonding pad I1 is impressed into the inverter 501. The wiring resistance being sufficiently small than the resistance of the pull-up resistor R1, the inverter 501 outputs the control signal MODE OUT at HIGH level.

When the bonding pad I1 is left open at high impedance, input level of the inverter 501 is pulled up to the power supply voltage through the pull-up resistor R1 and the inverter 501 outputs the control signal MODE OUT at LOW level.

Thus, the through current in the inverter 501 can be prevented in the conventional input circuit of FIG. 5. However, another current flows there through the pull-up resistor R1, when the bonding pad I1 is bonded to the ground GND. The current flowing through the pull-up resistor R1 may be decreased by increasing the resistance of the pull-up resistor R1, but when it becomes high, the input level of the inverter 501 becomes susceptible to noises in case the bonding pad I1 is left open.

A proposal for providing robustness against noises as well as decreasing the current flowing through the pull-up resistor is disclosed in a Japanese patent application laid open as a Provisional Publication No. 203409/'91.

FIG. 6 is a circuit diagram illustrating input circuit of the proposal. In the prior art of FIG. 6, a mode select signal MODE from the bonding pad I1 is connected through an input resistor R2 to an input terminal of an inverter 501 for outputting control signal MODE OUT to be supplied to inner circuits of the microcomputer chip, and input terminal of the inverter 501 is coupled to the power supply VDD through a parallel connection of a pull-up resistor R1 and a pMOS transistor P2 gated by the output signal MODE OUT of the inverter 501.

In case the bonding pad I1 is bonded to the ground GND, the power supply voltage is divided by the input resistor R2 and the pull-up resistor R1 to be input to the inverter 501. Therefore, when the resistance of the input resistor R2 is sufficiently smaller than that of the pull-up resistor R1, the input level of the inverter 501 becomes sufficiently low and the inverter 501 outputs the control signal MODE OUT at HIGH level, which maintains the PMOS transistor P2 at status OFF.

In case the bonding pad I1 is left open at high impedance, the input level of the inverter 501 is pulled up to HIGH level by the power supply voltage through the pull-up resistor R1 and the control signal MODE OUT output from the inverter 501 becomes LOW, turning the pMOS transistor P2 to ON. So, the input level of the inverter 501 is maintained stably at HIGH level even when a pull-up resistor R1 of high resistance is applied for decreasing the current flowing there. And, by selecting appropriate values for the resistance of the input resistor R2 and ON-resistance of the pMOS transistor P2, a hysteresis characteristic can be realized in the input circuit even when the inverter 501 has not hysteresis characteristic.

FIG. 7 illustrates another example of the countermeasures for preventing power dissipation of the input circuit, wherein a PMOS transistor P3 is provided between the pull-up resistor R1 and the power supply VDD in addition to the input circuit of FIG. 5. A power save signal PS at HIGH level is impressed in another bonging pad I2 connected to gate of the pMOS transistor P3 in case the bonding pad I1 is bonded to the ground GND for outputting the control signal MODE OUT at HIGH level, while the power save signal PS is turned to LOW in case the bonding pad I1 is left open for outputting the control signal MODE OUT at LOW level.

Therefore, the current dissipation through the pull-up resistor R1 is prevented in the input circuit of FIG. 7 by the pMOS transistor P3, even when resistance of the pull-up resistor R1 is set low for stabilizing the input level of the inverter 501 while the bonding pad I1 is left open at high impedance.

As above described, a stable input circuit can be provided in the prior art of FIG. 6. However, some currents rest there yet flowing through the input resistor R2 and the pull-up resistor R1, and furthermore, the higher resistance takes the wider layout space on the semiconductor chip, making the higher the production cost. This is a problem.

In the input circuit of FIG. 7, almost of the through current can be prevented, but there must be provided a control circuit for preparing the power save signal PS on the semiconductor chip or outside and another on-chip bonding pad I2 for supplying the power save signal PS, needing an additional layout space and a considerable cost after all.

SUMMARY OF THE INVENTION

Therefore, a primary object of the invention is to provide an input circuit for mode setting with a simple configuration sufficiently stable, preventing unnecessary current consumption.

In order to achieve the object, an input circuit of the invention for outputting a control signal of logic HIGH when a mode setting terminal thereof is at logic LOW and outputting the control signal of logic LOW when the mode setting terminal is left open; comprises:

latch means being reset with a rising edge of a reset signal to output the control signal of logic LOW and latching logic of the mode setting terminal with a falling edge of a delayed signal of said reset signal for maintaining to output inverse logic of said logic of the mode setting terminal latched; and pull-up means becoming ON for pulling up the mode setting terminal to logic HIGH when the mode setting terminal is left open gated by logic LOW of the control signal and becoming OFF for cutting a current flowing through the mode setting terminal gated by logic HIGH of the control signal.

Therefore, an input circuit for outputting a stable control signal for mode setting can be provided in the invention without any resistance element, unnecessary current flowing through the mode setting terminal being prevented.

BRIEF DESCRIPTION OF THE DRAWINGS

The foregoing, further objects, features, and advantages of this invention will become apparent from a consideration of the following description, the appended claims, and the accompanying drawings following in which the same numerals indicate the same or the corresponding parts.

DETAILED DESCRIPTION OF THE PREFERRED EMBODIMENTS

Now, embodiments of the present invention will be described in connection with the drawings.

Figure 1:
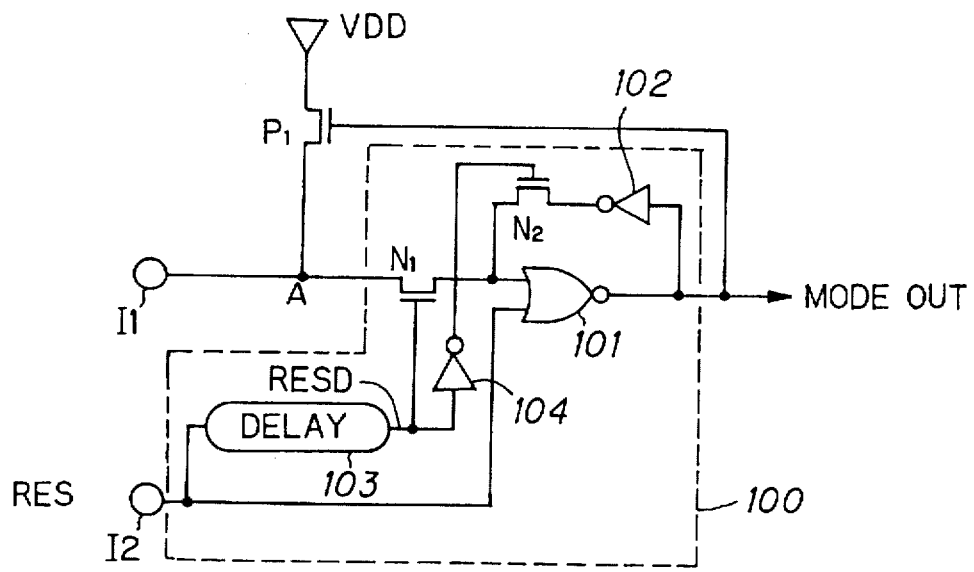
FIG. 1 is a circuit diagram illustrating an embodiment of the input circuit for mode setting of the invention.

FIG. 1 is a circuit diagram illustrating an embodiment of the input circuit for mode setting of the invention, comprising;

a NOR gate 101 having a first and a second input terminals and an output terminal for supplying a control signal MODE OUT to inner circuits, a pMOS transistor P1 connected between a first bonding pad I1 and a power supply VDD with its gate controlled by output of the NOR gate 101, a first nMOS transistor N1 connected between the first bonding pad I1 and the first input terminal of the NOR gate 101, a first inverter 102 with its input terminal connected to output terminal of the NOR gate 101, a second nMOS transistor N2 connected between output terminal of the first inverter 102 and the first input terminal of the NOR gate 101, a delay circuit 103 with its input terminal connected to a second bonding pad I2 and its output terminal connected to gate of the first nMOS transistor N1, the second bonding pad I2 also connected to the second input terminal of the NOR gate 101, and a second inverter 104 with its input terminal connected to output terminal of the delay circuit 103 and its output terminal connected to gate of the second nMOS transistor N2.

Here, it is noted that a static latch circuit 100 is composed of the first nMOS transistor N1, the NOR gate 101, the first inverter 102 and the second nMOS transistor N2 together with the delay circuit 103 and the second inverter 104.

Figure 3:
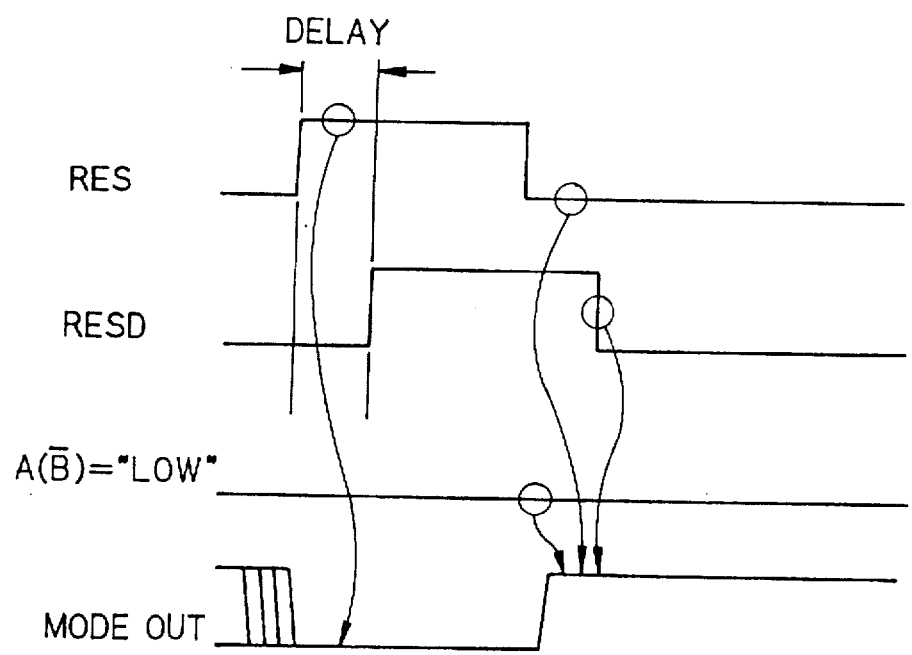
FIG. 3 is a timing chart illustrating operation of the embodiments in case the first bonding pad I1 is bonded to a ground GND.

Now, operation of the embodiment of FIG. 1 in case the first bonding pad I1 is bonded to a ground GND is described referring to a timing chart of FIG. 3 illustrating signals in the embodiment of FIG. 1.

When a reset signal RES delivered to the second bonding pad I2 turns from LOW level to HIGH level, the control signal MODE OUT output from the NOR gate 101 becomes LOW, the second input terminal of the NOR gate 101 becoming HIGH. Then, the pMOS transistor P1 is gated to ON by the control signal MODE OUT turned to LOW, and potential A of connection point of the pMOS transistor P1 and the first bonding pad I1 is represented as follows;

$$A = Vdd \times r2/(r1+r2) \quad (1)$$

where Vdd, r1 and r2 are potential of the power supply VDD, ON-resistance of the pMOS transistor P1 and grounding impedance of the bonding pad I1, respectively.

As the grounding impedance r2 is sufficiently small than the ON-resistance r1, the potential A is approximated as follows;

$$A \approx Vdd \times r2/r1 \approx 0. \quad (2)$$

So, the potential A of the connection point becomes nearly equal to potential of the ground GND.

Then, through the first nMOS transistor N1, becoming ON gated by delayed reset signal RESD output from the delay circuit 103 and turning to HIGH following the reset signal RES, LOW level of the potential A is delivered to the first input terminal of the NOR gate 101. At this timing when the reset signal RES remains at HIGH level, the control signal MODE OUT at LOW level is output from the NOR gate 101 and HIGH level of the output of the first inverter 102 is cut off from the first input terminal of the NOR gate 101 by the second nMOS transistor N2 at status OFF gated with inverted logic of HIGH level of the delayed reset signal RESD.

When the reset signal RES turns to LOW and both of the first and the second input terminals of the NOR gate 101 become LOW, the control signal MODE OUT turns to HIGH, which makes the pMOS transistor P1 at status OFF, maintaining the potential A at the potential of the first bonding pad I1, that is, at LOW level.

Then, the delayed reset signal RESD turning to LOW following the reset signal RES, the first nMOS transistor N1 becomes OFF and the second nMOS transistor N2 becomes ON in turn, and so the first input terminal of the NOR gate 101 becomes LOW controlled by inverted logic of the control signal MODE OUT already turned to HIGH level.

Thus, the LOW level of the potential A at the first bonding pad I1 is latched by the static latch 100 with a pulse of HIGH level of the reset signal RES and the control signal MODE OUT output from the NOR gate 101 is maintained at HIGH level stably as long as the reset signal RES remains LOW.

Figure 4:
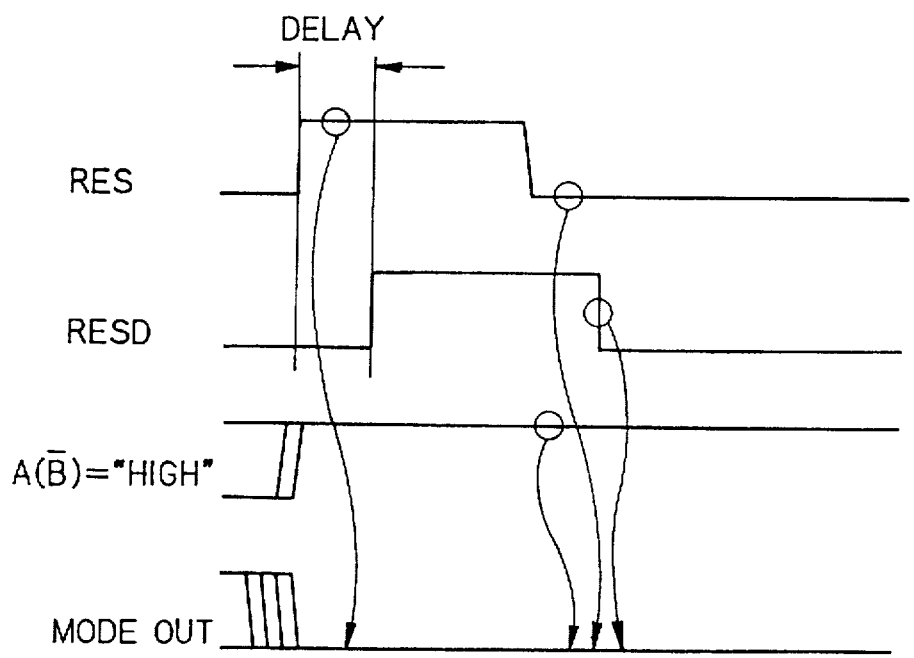
FIG. 4 is a timing chart illustrating operation of the embodiments in case the first bonding pad I1 is left open.

FIG. 4 is a timing chart illustrating operation of the embodiment of FIG. 1 in case the first bonding pad I1 is left open.

When the reset signal RES input to the second input terminal of the NOR gate 101 turns to HIGH, the control signal MODE OUT output from the NOR gate 101 becomes LOW, which makes the pMOS transistor P1 at status ON. As the first bonding pad I1 is left open in the case, the potential A of the connection point becomes HIGH pulled up to the power supply voltage Vdd. When the delayed reset signal RESD turns to HIGH following the reset signal RES, the first nMOS transistor N1 connects the HIGH level of the potential A to the first input terminal of the NOR gate 101, the control signal MODE OUT remaining at LOW level. At this timing, the second nMOS transistor N2 is gated to status OFF with inverted logic of the delayed reset signal RESD similarly in case of FIG. 3 when the first bonding pad is bonded to the ground GND.

When the reset signal RES supplied to the second input terminal of the NOR gate 101 returns to LOW, the control signal MODE OUT remains at LOW level, the first input terminal of the NOR gate 101 delivered with the potential A at HIGH level. Then, the delayed reset signal RESD returning to LOW, the first nMOS transistor N1 becomes OFF and the second nMOS transistor N2 becomes ON, and the first input terminal of the NOR gate 101 becomes controlled with HIGH level of the output of the first inverter 102, that is, inverted logic of the control signal MODE OUT.

Thus, the HIGH level of the potential A is latched with a HIGH level of the reset signal RES and the NOR gate 101 outputs the control signal MODE OUT at LOW level stably even after the reset signal RES returned to LOW level.

Therefore, both in case the first bonding pad I1 is bonded to the ground GND and in case it is left open, the status of the bonding pad I1 is stably latched in the embodiment and the NOR gate 101 can maintain the control signal MODE OUT at HIGH level or LOW level according to the status of the bonding pad I1 after the delayed reset signal RESD returned to LOW level without any unnecessary through current, because the pull-up transistor P1 is controlled to OFF when the control signal is at HIGH level as above described.

And, the input circuit of the embodiment needs no additional bonding pad nor control circuit, since it is controlled with the reset signal RES supplied to the second bonding pad I2, both of which are generally provided for microcomputer chips for initializing their inner-circuits when they are made active.

Figure 5:
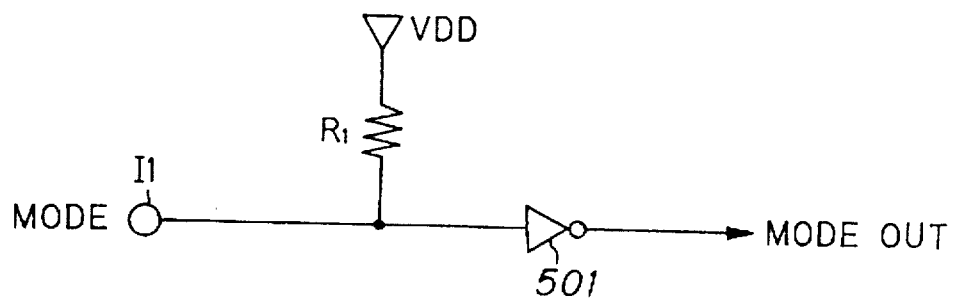
FIG. 5 shows an example of conventional input circuits for mode setting.
Figure 6:
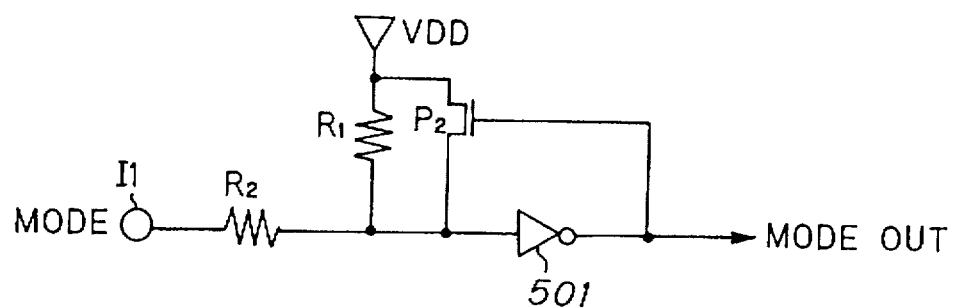
FIG. 6 is a circuit diagram illustrating input circuit of a prior art.
Figure 7:
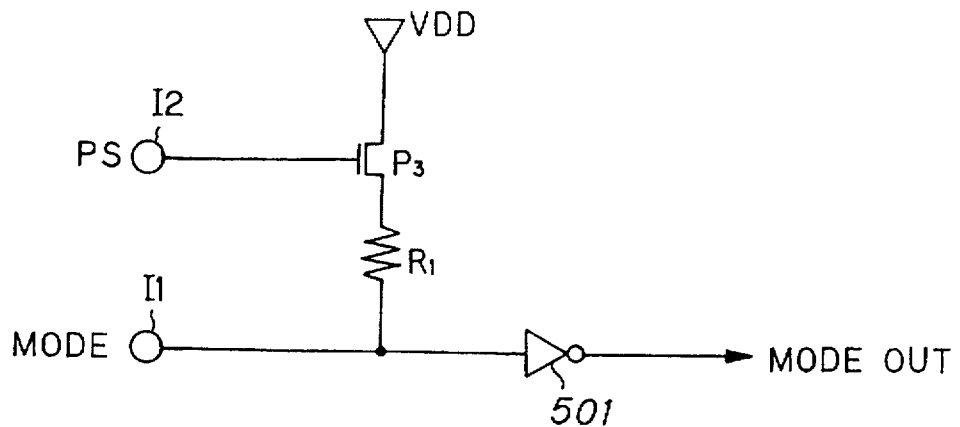
FIG. 7 illustrates another example of the conventional input circuit for mode setting.

And further, the input circuit of the embodiment without any resistance element can be configured on a smaller semiconductor chip than the input circuits of prior arts such as illustrated in FIG. 5 to FIG. 7 comprising resistor elements of high resistance needing wide layout spaces on the semiconductor chips.

Thus, an input circuit for mode setting sufficiently stable and without unnecessary current consumption can be provided in the embodiment with a simple configuration.

Figure 2:
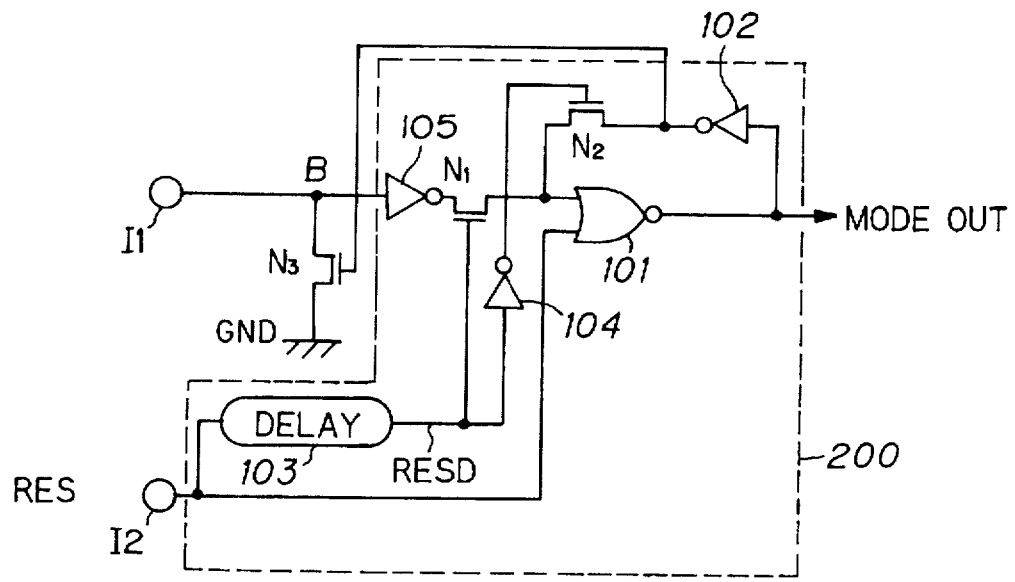
FIG. 2 is a circuit diagram illustrating another embodiment of the invention.

FIG. 2 is a circuit diagram illustrating another embodiment of the invention having a similar configuration with the embodiment of FIG. 1 except that the first bonding pad I1 is coupled to the ground GND through a third nMOS transistor N3 gated with inverted logic, output of the first inverter 102, of the control signal MODE OUT, in place of the pMOS transistor P1, and that a third inverter 105 is further provided between source of the first nMOS transistor N1 and connection point of the third nMOS transistor N3 and the first bonding pad I1.

Here in the embodiment of FIG. 2, a static latch circuit 200 is composed of the first nMOS transistor N1, the NOR gate 101, the first inverter 102 and the second nMOS transistor N2 together with the delay circuit 103 and the second and the third inverters 104 and 105.

In the embodiment of FIG. 2, level of the control signal MODE OUT is determined by bonding the first bonding pad I1 to the power supply VDD or leaving it open un-bonded to anywhere.

Referring again to FIG. 3, operation of the embodiment of FIG. 2 in case the first bonding pad I1 is bonded to the power supply VDD is described.

When the reset signal RES delivered to the second bonding pad I2 turns from LOW level to HIGH level, the control signal MODE OUT output from the NOR gate 101 becomes LOW, the second input terminal of the NOR gate 101 becoming HIGH. Then, the third nMOS transistor N3 is gated to ON by inverted logic of the control signal MODE OUT turned to LOW, and potential B of connection point of the third nMOS transistor N3 and the first bonding pad I1 is represented as follows;

$$B = Vdd \times r3/(r3 + r2) \tag{3}$$

where Vdd, r3 and r2 are potential of the power supply VDD, ON-resistance of the third nMOS transistor N3 and the grounding impedance of the bonding pad I1, respectively.

As the grounding impedance r2 is sufficiently small than the ON-resistance r3, the potential B is approximated as follows;

$$B \approx Vdd \times r3/r3 = Vdd. \tag{4}$$

So, the potential B of the connection point becomes nearly equal to potential of the power supply VDD.

Then, through the first nMOS transistor N1, becoming ON gated by delayed reset signal RESD, output from the delay circuit 103 and turning to HIGH following the reset signal RES, logic LOW inverted of HIGH level of the potential B is delivered to the first input terminal of the NOR gate 101. At this timing when the reset signal RES remains at HIGH level, the control signal MODE OUT at LOW level is output from the NOR gate 101 and HIGH level of the output of the first inverter 102 is cut off from the first input terminal of the NOR gate 101 by the second nMOS transistor N2 at status OFF gated with inverted logic of HIGH level of the delayed reset signal RESD.

When the reset signal RES turns to LOW and both of the first and the second input terminals of the NOR gate 101 become LOW, the control signal MODE OUT turns to HIGH, which makes the third nMOS transistor N3 at status OFF through the first inverter 102, maintaining the potential B at the potential of the first bonding pad I1, that is, at HIGH level.

Then, the delayed reset signal RESD turning to LOW following the reset signal RES, the first nMOS transistor N1 becomes OFF and the second nMOS transistor N2 becomes ON in turn, and so the first input terminal of the NOR gate 101 becomes controlled with inverted logic of the control signal MODE OUT already turned to HIGH level.

Thus, the HIGH level of the potential B at the first bonding pad I1 is latched by the static latch 200 with a pulse of HIGH level of the reset signal RES and the control signal MODE OUT output from the NOR gate 101 is maintained at HIGH level stably as long as the reset signal RES remains LOW.

The operation of the embodiment of FIG. 4 in case the first bonding pad I1 is left open can be illustrated also by the timing chart of FIG. 4.

When the reset signal RES input to the second input terminal of the NOR gate 101 turns to HIGH, the control signal MODE OUT output from the NOR gate 101 becomes LOW, which makes the third nMOS transistor N3 at status ON. As the first bonding pad I1 is left open in the case, the potential B of the connection point becomes LOW pulled down to the potential of the ground GND. When the delayed reset signal RESD turns to HIGH following the reset signal RES, the first nMOS transistor N1 connects inverted logic HIGH of the LOW level of the potential B to the first input terminal of the NOR gate 101, the control signal MODE OUT remaining at LOW level. At this timing, the second nMOS transistor N2 is gated to status OFF with inverted logic of the delayed reset signal RESD similarly in case of FIG. 3 when the first bonding pad is bonded to the power supply VDD.

When the reset signal RES supplied to the second input terminal of the NOR gate 101 returns to LOW, the control signal MODE OUT remains at LOW level, the first input terminal of the NOR gate 101 delivered with the inverted logic HIGH of the potential B of LOW level. Then, the delayed reset signal RESD returning to LOW, the first nMOS transistor N1 becomes OFF and the second nMOS transistor N2 becomes ON, and so, the first input terminal of the NOR gate 101 becomes controlled with HIGH level of the output of the first inverter 102, that is, inverted logic of the control signal MODE OUT.

Thus, the LOW level of the potential B is latched with a HIGH level of the reset signal RES and the NOR gate 101 outputs the control signal MODE OUT at LOW level stably even after the reset signal RES returned to LOW level.

Therefore, both in case the first bonding pad I1 is bonded to the power supply VDD and in case it is left open, the status of the bonding pad I1 is stably latched in the embodiment and the NOR gate 101 can maintain the control signal MODE OUT at HIGH level or LOW level according to the status of the bonding pad I1 after the delayed reset signal RESD returned to LOW level without any unnecessary through current from the bonding pad I2 to the ground GND, because the pull-down transistor N3 is controlled to OFF when the control signal is at HIGH level as above described.

And, the input circuit of FIG. 2 needing no additional bonding pad nor control circuit can be configured on a smaller semiconductor chip than the input circuits of prior arts such as illustrated in FIG. 5 to FIG. 7, similarly to the embodiment of FIG. 1.

Thus, an input circuit for mode setting sufficiently stable and without unnecessary current consumption can be provided with a simple configuration in the invention even when it is more practical to prepare a bonding pad for mode setting besides a bonding pad for a power supply.

What is claimed is:

1. An input circuit for outputting a control signal of logic HIGH when a mode setting terminal thereof is at logic LOW and outputting the control signal of logic LOW when the mode setting terminal is left open; comprising:

latch means being reset with a rising edge of a reset signal to output the control signal of logic LOW and latching logic of the mode setting terminal with a falling edge of a delayed signal of said reset signal for maintaining to output inverse logic of said logic of the mode setting terminal latched; and pull-up means becoming ON for pulling up the mode setting terminal to logic HIGH when the mode setting terminal is left open gated by logic LOW of the control signal and becoming OFF for cutting a current flowing through the mode setting terminal gated by logic HIGH of the control signal.

2. An input circuit recited in claim 1, said latch means comprising:

a NOR gate having a first and a second input terminals and outputting the control signal having NOR logic of logic delivered to said first and said second input terminals, said second input terminal supplied with said reset signal;

a first nMOS transistor connected between the mode setting terminal and said first input terminal of said NOR gate;

a first inverter for outputting inverse logic of the control signal;

a second nMOS transistor for connecting output of said first inverter to said first input terminal of said NOR gate;

a delay circuit for outputting said delayed signal of said reset signal, said delayed signal gating said first nMOS transistor; and a second inverter for outputting inverted logic of said delayed signal to gate said second nMOS transistor.

3. An input circuit recited in claim 1, said pull-up means comprising a pMOS transistor gated by the control signal for connecting the mode setting terminal to a power supply.

4. An input circuit for outputting a control signal of logic HIGH when a mode setting terminal thereof is at logic HIGH and outputting the control signal of logic LOW when the mode setting terminal is left open; comprising:

latch means being reset with a rising edge of a reset signal to output the control signal of logic LOW and latching logic of the mode setting terminal with a falling edge of a delayed signal of said reset signal for maintaining to output the same logic with said logic of the mode setting terminal latched; and pull-down means becoming ON for pulling down the mode setting terminal to logic LOW when the mode setting terminal is left open gated by logic LOW of the control signal and becoming OFF for cutting a current flowing through the mode setting terminal gated by logic HIGH of the control signal.

5. An input circuit recited in claim 4, said latch means comprising:

a NOR gate having a first and a second input terminals for outputting the control signal having NOR logic of logic delivered to said first and said second input terminals, said second input terminal supplied with said reset signal;

a first nMOS transistor for connecting inverted logic of the mode setting terminal to said first input terminal of said NOR gate;

a first inverter for outputting inverse logic of the control signal;

a second nMOS transistor for connecting output of said first inverter to said first input terminal of said NOR gate;

a delay circuit for outputting said delayed signal of said reset signal, said delayed signal gating said first nMOS transistor;

a second inverter for outputting inverted logic of said delayed signal to gate said second nMOS transistor; and a third inverter for outputting said inverted logic of the mode setting terminal.

6. An input circuit recited in claim 4, said pull-down means comprising a third nMOS transistor gated by inverted logic of the control signal for grounding the mode setting terminal.

* * * * *